(12) United States Patent
Huang et al.

(10) Patent No.: US 6,555,854 B2
(45) Date of Patent: Apr. 29, 2003

(54) CHARGE COUPLED DEVICE WITH MULTI-FOCUS LENGTHS

(75) Inventors: Yin-Chun Huang, Hsin-Chu (TW); Chih-Wen Huang, Hsin-Chu (TW)

(73) Assignee: Umax Data Systems Inc. (TW)

( * ) Notice: Subject to any disclaimer, the term of this patent is extended or adjusted under 35 U.S.C. 154(b) by 169 days.

(21) Appl. No.: 09/840,897

(22) Filed: Apr. 25, 2001

(65) Prior Publication Data

US 2002/0158274 A1 Oct. 31, 2002

(51) Int. Cl.[7] .......................... H01L 29/78; H01L 33/00
(52) U.S. Cl. .................. 257/222; 257/224; 257/227
(58) Field of Search .............................. 257/222, 224, 257/227

(56) References Cited

U.S. PATENT DOCUMENTS 5,118,924 A * 6/1992 Mehra et al.

* cited by examiner

Primary Examiner—Stephen D. Meier

(57) ABSTRACT

A charge coupled device (CCD) with multi-focus lengths is provided. The arrays of optical sensors with a plurality of transparent plates in parallel disposed thereon are disposed on a substrate. By way of either of changing the thicknesses of the transparent plates and changing the position levels of the arrays of the optical sensors, each of the arrays of the optical sensors obtains a different focal length. And thus, the depth of focus of the present charge coupled device is improved.

10 Claims, 5 Drawing Sheets

CHARGE COUPLED DEVICE WITH MULTI-FOCUS LENGTHS

BACKGROUND OF THE INVENTION

1. Field of the Invention

The present invention relates to a photosensitive device, and more particularly to a photosensitive device with multi-focus lengths.

2. Description of the Prior Art

Many kinds of devices exist for sensing color images. Theses devices can be desktop or hand held scanners, copying machines, facsimile machines and the like. FIG. 1 shows a schematic cross-sectional view of a scanner head 11 inside the housing of a conventional reflective-type scanner 10. During scanning, a light source 12 illuminates an original 13, such as a document. The optical system comprised of a set of mirrors 14 and a lens assembly 15 directs the optical path of the reflective light from the original 13 and focuses it onto a photosensitive detector 16.

The charge coupled device (CCD) is generally used as the photosensitive detector 16. FIG. 2A is a schematic cross-sectional view of a conventional charge coupled device 20 in the longitudinal direction. In general, the charge coupled device 20 is comprised of a substrate 21, an array of optical sensors 22 and a transparent glass plate 23 with a constant thickness. The array of the optical sensors 22 are disposed on the substrate 21. The transparent glass plate 23 is disposed on the array of the optical sensors 22 served as a cover thereof to prevent being touched and dust. FIG. 2B is an enlarged schematic cross-sectional view of the charge coupled device 20 in the transverse direction, in which each optical sensor 22 is comprised of a R sensor element 221, a G sensor element 222 and a B sensor element 223. R, G and B herein respectively represent primary colors, red, green and blue.

In this conventional charge coupled device 20, the optical sensor 22 is comprised of only a set of R, G, and B sensor elements (221, 222, 223). And, the transparent glass plate 23 used as the cover of the array of the optical sensors 22 is provided with a constant thickness and a certain refractive index. Thus, the focal length of this charge coupled device 20 is limited. The depth of focus of this charge coupled device 20 is also limited. Referring to FIG. 1, the focal length herein means the optical distance between the lens assembly 15 and the array of the optical sensors 22 of the charge coupled device 20 when the image of the original 13 is focused onto the optical sensors 22. The depth of focus means the variable range of the focus length of the charge coupled device 20. When the resolution for image capture of a scanning system becomes higher and higher, the depth of focus of the charge coupled device 20 is also narrowed. It is therefore more difficult to fulfill the requirement of the scanning system with various high resolutions by way of adjusting the positions of the mirrors 14, the lens assembly 15 and the charge coupled device 20.

Accordingly, it is an intention to provide a charge coupled device with multi-focus lengths to fill the demand of the scanning system with various high resolutions.

SUMMARY OF THE INVENTION

It is one objective of the present invention to provide a charge coupled device (CCD) with multi-focus lengths, in which a plurality of transparent plates are disposed on the arrays of optical sensors in parallel. Each of the transparent plates corresponds to one of the arrays of the optical sensors. By way of either of changing the thicknesses of the transparent plates and changing the position levels of the arrays of the optical sensors, each array of the optical sensors obtains a different focus length. And thus, the depth of focus of the present CCD is improved. On the other hand, the depth of field of the object with the image to be read out is also improved.

It is another objective of the present invention to provide a charge coupled device with multi-focus lengths, which improves the depth of focus of this device to fulfill demand of a scanning system for capturing one image with various high resolutions.

It is a further objective of the present invention to provide a charge coupled device with multi-focus lengths, which is easily manufactured and has low production cost.

It is still a further objective of the present invention to provide a charge coupled device with multi-focus lengths, which is applicable to a scanner, a facsimile machine, a copying machine and the like.

In order to achieve the above objectives of this invention, the present invention provides a charge coupled device with multi-focus lengths. The present charge coupled device comprises a substrate, a plurality of arrays of optical sensors and a plurality of transparent plates. The arrays of the optical sensors are disposed on the substrate. Each of the arrays has a plurality of the optical sensors and each of the optical sensors includes a R sensor element, a G sensor element and a B sensor element. Each of the transparent plates is provided with a respective thickness and disposed on one of the arrays of the optical sensors. By means of the arrangement of the transparent plates with different thicknesses in parallel disposed on the arrays of the optical sensors, each of the arrays of the optical sensors obtains a different focus length. Therefore, the depth of focus of the present charge coupled device is improved. On the other hand, the depth of field of the object with the image to be read out is improved.

BRIEF DESCRIPTION OF THE DRAWINGS

The objectives and features of the present invention as well as advantages thereof will become apparent from the following detailed description, considered in conjunction with the accompanying drawings. It is to be understood, however, that the drawings, which are not to scale, are designed for the purpose of illustration and not as a definition of the limits of the invention, for which reference should be made to the appended claims.

DESCRIPTION OF THE EMBODIMENTS

Figure 1:
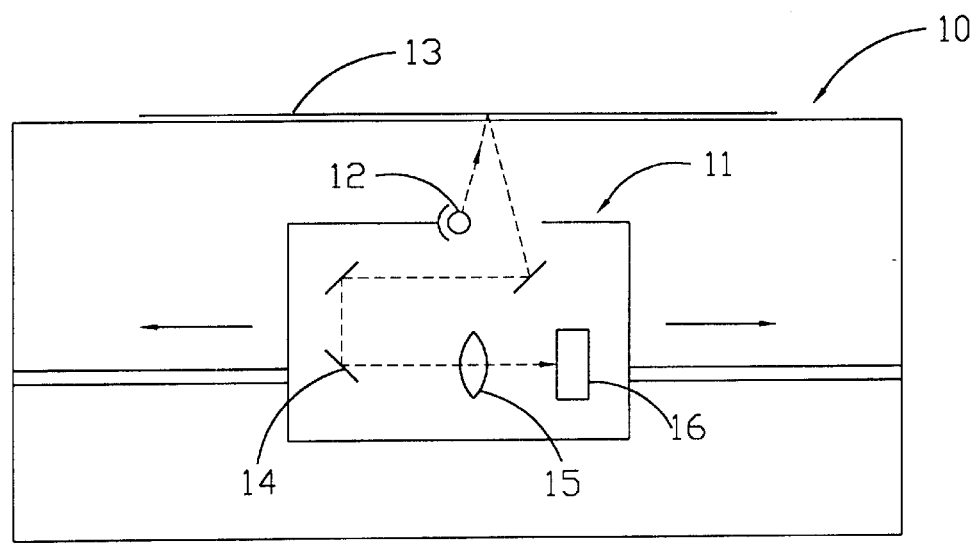
FIG. 1 is a schematic cross-sectional view of a scanner head within a prior scanner.
Figure 2A:
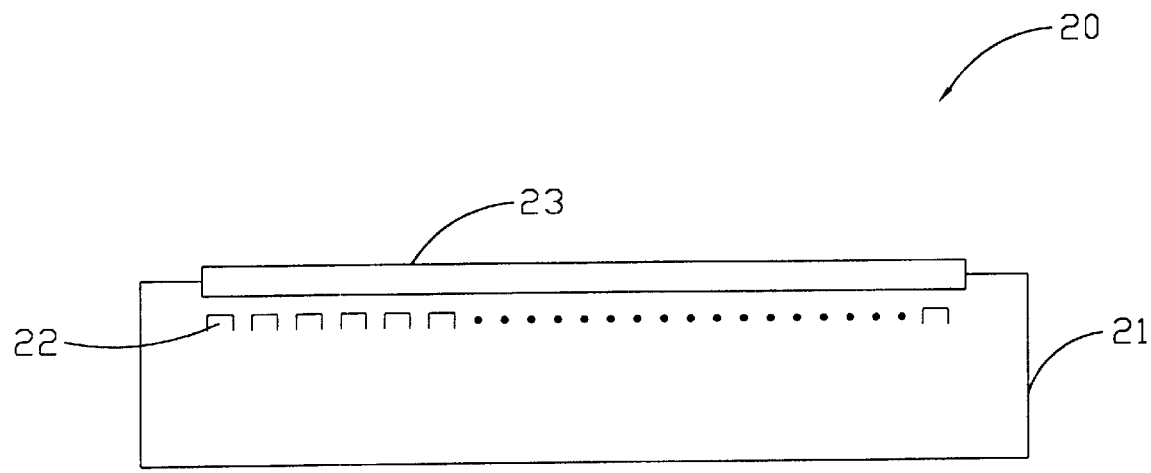
FIG. 2A is a schematic cross-sectional view of a conventional charge coupled device in the longitudinal direction.
Figure 2B:
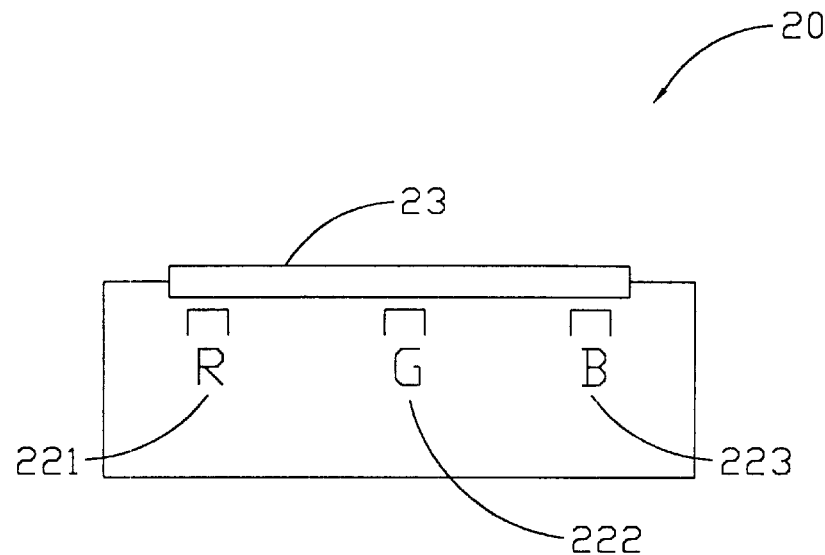
FIG. 2B is an enlarged schematic cross-sectional view of the conventional charge coupled device in the transverse direction.
Figure 3A:
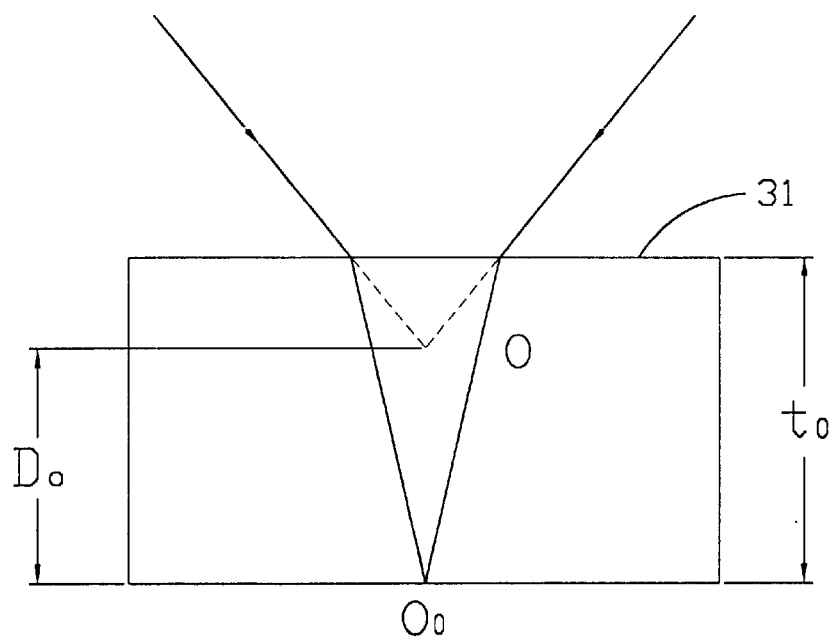
FIG. 3A to FIG. 3C shows examples describing how the focal position is varied when light passing a transparent medium according to the refraction law.
Figure 3B:
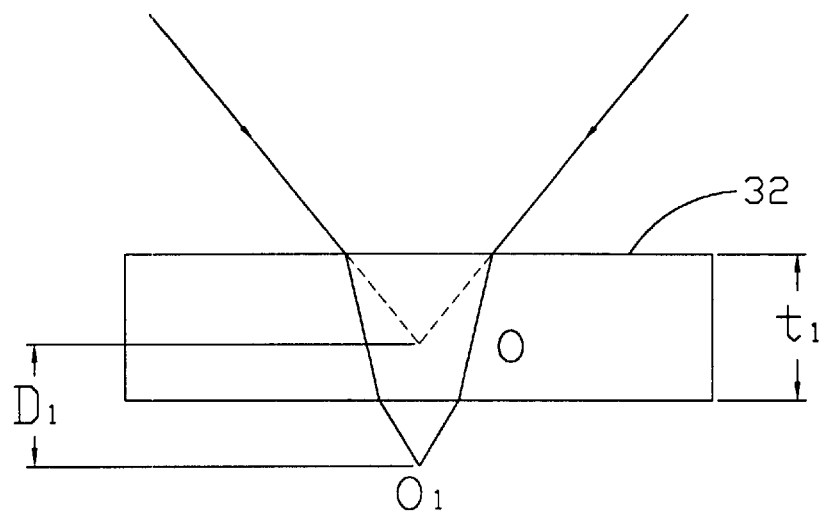
Figure 3C:
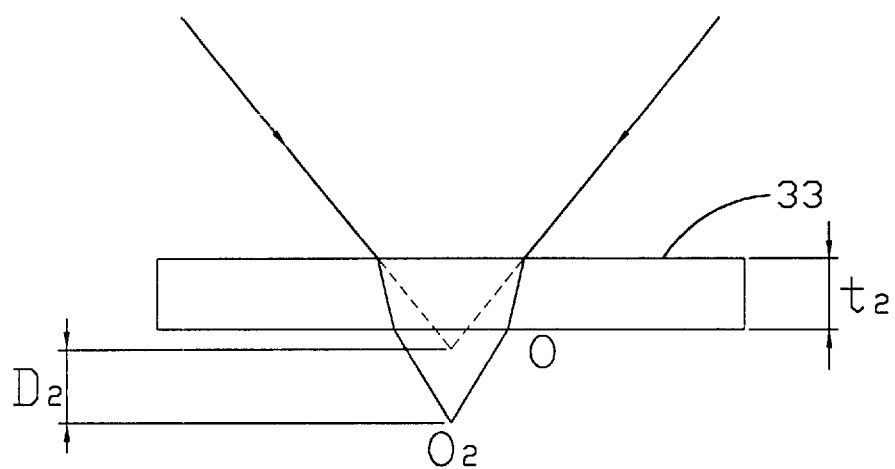

FIG. 3A to FIG. 3C gives examples to describe how the focus position is varied when light passing through a transparent medium according to the refractive law. $t_0$, $t_1$ and $t_2$ represents the respective thickness of the transparent mediums 31, 32 and 33. The transparent mediums 31, 32 and 33 are formed of the same material. When light respectively passes through these three transparent mediums 31, 32 and 33, the original focus position O is changed to $O_0$, $O_1$ and $O_2$, respectively, due to light refraction within the transparent mediums 31, 32 and 33. $D_0$, $D_1$ and $D_2$ respectively represent the distance between the original focus position O and each of the changed focus positions $O_0$, $O_1$ and $O_2$. When $t_0 > t_1 > t_2$, the result is $D_0 > D_1 > D_2$. When the transparent medium becomes thicker, the changed focus position becomes more far away from the original focus position.

In accordance with this property, the present invention provides a charge coupled device with multi-focus lengths, thereby improving the depth of focus of the charge coupled device.

The present invention will be described and explained in detail with the following three embodiments.

Figure 4A:
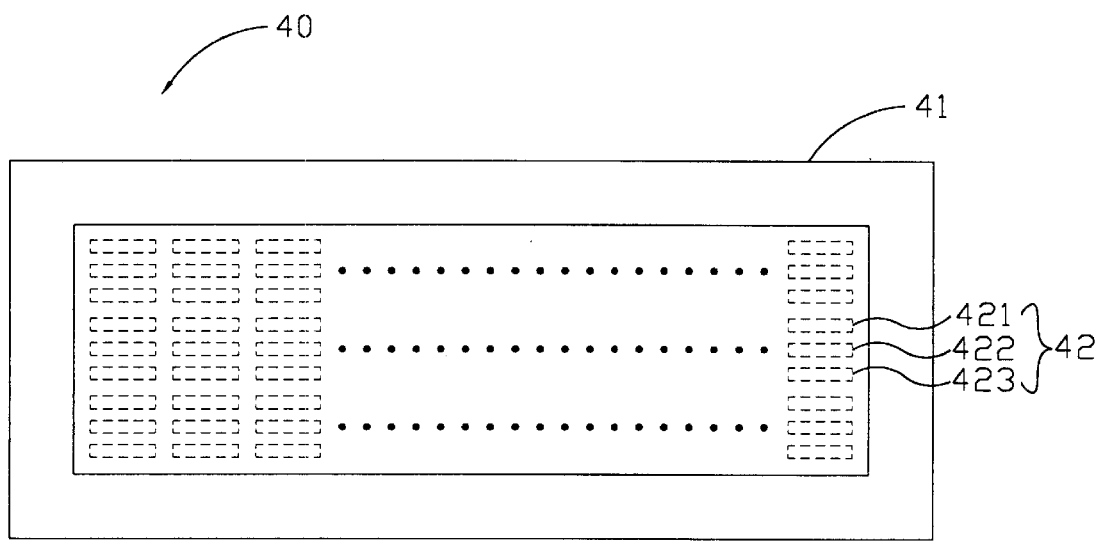
FIG. 4A is a schematic top view of one charge coupled device according to a first embodiment of the present invention.
Figure 4B:
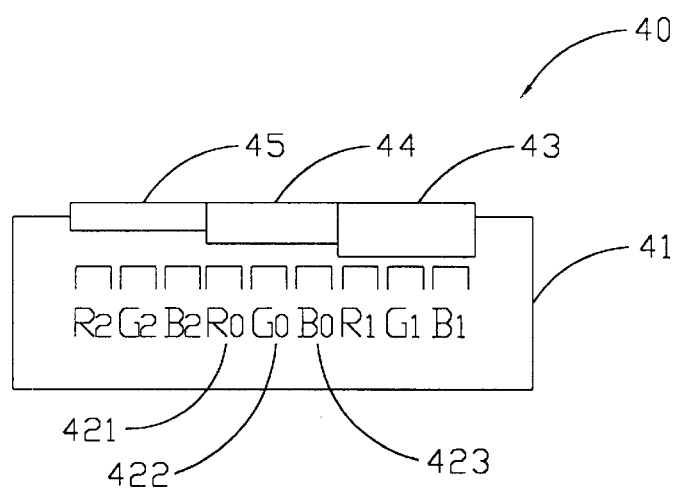
FIG. 4B is a schematic cross-sectional view of the charge coupled device of FIG. 4A in the longitudinal direction.

FIG. 4A and FIG. 4B show one first embodiment of the present invention. FIG. 4A is a schematic top view of the first embodiment and FIG. 4B is a schematic cross-sectional view of the first embodiment in the transverse direction. The charge coupled device 40 of the first embodiment is comprised of a substrate 41, three arrays of optical sensors 42 and three elongated transparent plates with different thicknesses 43, 44 and 45. Referring to FIG. 4B, the three arrays of the optical sensors 42 are disposed on the substrate 41 in the same level. Each array includes a plurality of the optical sensors 42, and each optical sensors 42 is comprised of a set of a R sensor element 421, a G sensor element 422 and a B sensor element 423. The three elongated transparent plates 43, 44 and 45 are in parallel disposed on the three arrays of the optical sensors 42 used as a cover to prevent being touched and dust, etc. Each of the transparent plates 43, 44 and 45 corresponds to one of the arrays of the optical sensors 42. The three transparent plates 43, 44 and 45 can be formed of transparent glass and the like.

Since the elongated transparent plates 43, 44 and 45 disposed on the three arrays of the optical sensors 42 have different thicknesses, each of these three arrays of the optical sensors 42 obtains a different focus length. Accordingly, a charge coupled device 40 with multi-focus lengths is provided. When scanning an original, such as a document, the charge coupled device 40 will simultaneously obtain three sets of image data, respectively detected by the three optical sensors 42, i.e. (R0, G0, B0), (R1, G1, B1) and (R2, G2, B2). The optimum data among these three data is picked out and transmitted to one processing unit to proceed further processing.

Although the charge coupled device 40 of the first embodiment of the present invention comprises three arrays of the optical sensors 42, the number of the optical sensor array of the present invention is not limited thereby, and is at least two.

Figure 5:
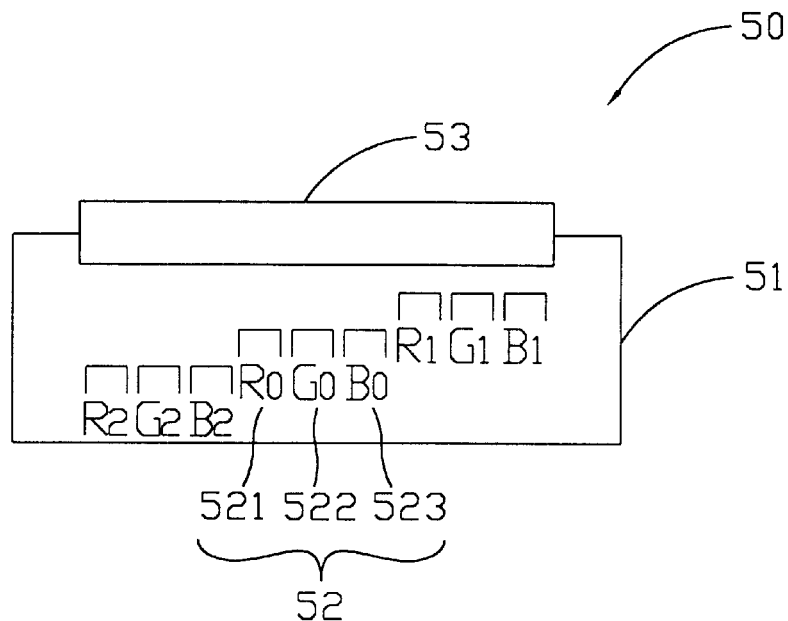
FIG. 5 is a schematic cross-sectional view of one charge coupled device according to a second embodiment of the present invention in the longitudinal direction.

FIG. 5 is a schematic cross-sectional view of a second embodiment of the present invention in the transverse direction. The charge coupled device 50 of the second embodiment is comprised of a substrate 51, three arrays of optical sensors 52 and a transparent plate 53. The three arrays of the optical sensors 52 are disposed on the substrate 51 in different levels. Each array of the optical sensors 52 includes a plurality of the optical sensors 52 and each optical sensor 52 is comprised of a R sensor element 521, a G sensor element 522 and a B sensor element 523. The transparent plate 53 with a predetermined thickness is disposed on these three arrays of the optical sensors 52. Since the three arrays of the optical sensors 52 are disposed on the substrate 51 in different levels, each array of the optical sensors 52 also obtains a different focus length.

Figure 6:
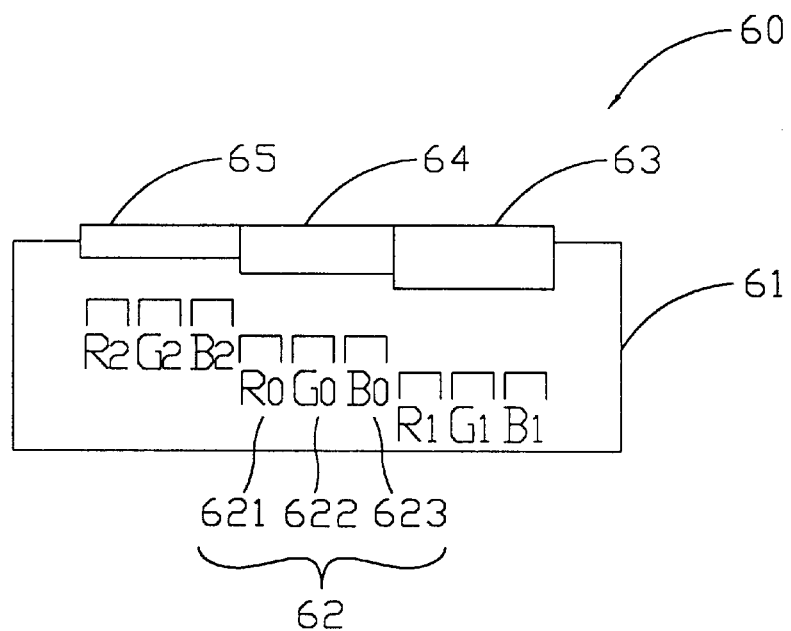
FIG. 6 is a schematic cross-sectional view of one charge coupled device according to a third embodiment of the present invention in the longitudinal direction.

FIG. 6 is a schematic cross-sectional view of a third embodiment of the present invention in the transverse direction. The charge coupled device 60 of the third embodiment is comprised of a substrate 61, three arrays of optical sensors 62 and three elongated transparent plates with different thicknesses 63, 64 and 65. The three arrays of the optical sensors 62 are disposed on the substrate 61 in different levels. Each array includes a plurality of the optical sensors 62 and each optical sensor 62 is comprised of a R sensor element 621, a G sensor element 622 and a B sensor element 623. These three transparent plates 63, 64 and 65 are disposed on the three arrays of the optical sensors 62 in parallel. Each transparent plate corresponds to one array of the optical sensors 62. By means of this arrangement of the arrays of the optical sensors 62 disposed on the substrate 61 in different levels and the transparent plates 63, 64 and 65 with different thicknesses, each array of the optical sensors 62 also obtains a different focus length.

The depth of focus of the present charge coupled device with multi-focus lengths is improved. Therefore, the present charge coupled device is useful in a scanning system with high resolution for capturing images. On the other hand, the depth of field of one object with the image to be read out is also improved when using a scanning system with the present charge coupled device. In addition, the present charge coupled device with multi-focus lengths is provided by way of either of changing the thicknesses of the transparent plates and changing the position levels of the arrays of the optical sensors. Therefore, the present charge coupled device is easily manufactured and has a low production cost.

The present charge coupled device with multi-focus lengths is applicable to a scanner, a facsimile machine, a copying machine and the like.

The embodiments are only used to illustrate the present invention, not intended to limit the scope thereof. Many modifications of the embodiments can be made without departing from the spirit of the present invention.

What is claimed is:

1. A charge coupled device (CCD) with multi-focus lengths, comprising:
   a substrate;
   a plurality of arrays of optical sensors disposed on said substrate, each of said arrays having a plurality of said optical sensors and each of said optical sensors including a R sensor element, a G sensor element and a B sensor element; and
   a plurality of transparent plates in parallel disposed on said arrays of said optical sensors, each said transparent plate having a respective thickness and corresponding to one of said arrays of said optical sensors.

2. The charge coupled device of claim 1, wherein the number of said arrays of said optical sensors is at least two.

3. The charge coupled device of claim 1, wherein said transparent plates are formed of transparent glass.

4. The charge coupled device of claim 1, wherein said arrays of said optical sensors are disposed on said substrate in the same level.

5. A charge coupled device with multi-focal lengths, comprising:

a substrate;

a plurality of arrays of optical sensors, each of which disposed on said substrate in a respective level and having a plurality of said optical sensors, each of said optical sensors including a R sensor element, a G sensor element and a B sensor element; and a transparent plate disposed on said arrays of said optical sensors.

6. The charge coupled device of claim 5, wherein the number of said arrays of said optical sensors is at least two.

7. The charge coupled device of claim 5, wherein said transparent plate is formed of a transparent glass.

8. A charge coupled device with multi-focal lengths, comprising:

a substrate;

a plurality of arrays of optical sensors, each of which disposed on said substrate in a respective level and having a plurality of said optical sensors, each of said optical sensors including a R sensor element, a G sensor element and a B sensor element; and a plurality of transparent plates in parallel disposed on said arrays of said optical sensors, each said transparent plate having a respective thickness and corresponding to one of said arrays of said optical sensors.

9. The charge coupled device of claim 8, wherein the number of said arrays of said optical sensors is at least two.

10. The charge coupled device of claim 8, wherein said transparent plates are formed of transparent glass.

* * * * *